United States Patent
Fujisawa et al.

(10) Patent No.: US 7,345,950 B2
(45) Date of Patent: Mar. 18, 2008

(54) SYNCHRONOUS SEMICONDUCTOR MEMORY DEVICE

(75) Inventors: Hiroki Fujisawa, Tokyo (JP); Shuichi Kubouchi, Tokyo (JP); Koji Kuroki, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 11/583,980

(22) Filed: Oct. 20, 2006

(65) Prior Publication Data

US 2007/0091714 A1   Apr. 26, 2007

(30) Foreign Application Priority Data

Oct. 20, 2005   (JP) ............... 2005-306418

(51) Int. Cl.
*G11C 8/00* (2006.01)
(52) U.S. Cl. ............... 365/233; 365/230.06; 365/236
(58) Field of Classification Search ............... 365/233, 365/230.04, 230.06, 236, 194
See application file for complete search history.

(56) References Cited

U.S. PATENT DOCUMENTS

| | | | |
|---|---|---|---|
| 6,628,276 B1 * | 9/2003 | Elliott | .............. 345/213 |
| 6,643,215 B2 | 11/2003 | Kwak | |
| 6,778,465 B2 * | 8/2004 | Shin | .............. 365/233 |
| 6,819,626 B2 * | 11/2004 | Okuda et al. | .............. 365/233 |
| 6,965,530 B2 * | 11/2005 | Shimbayashi | .............. 365/233 |
| 7,239,574 B2 * | 7/2007 | Koji | .............. 365/233 |

FOREIGN PATENT DOCUMENTS

JP    2002-230973    8/2002

\* cited by examiner

*Primary Examiner*—Gene N. Auduong
(74) *Attorney, Agent, or Firm*—McDermott Will & Emery LLP

(57) ABSTRACT

A synchronous semiconductor memory device of the present invention has a clock generator for generating a normal and a reverse phase clocks by dividing an external clock, a command decoder for decoding an external command and outputting a command signal; latency setting means capable of selectively setting an even or odd number latency within a range of a predetermined number of clock cycles of the external clock, a latency counter which includes two counter circuits for sequentially shifting the command signal captured using the normal and reverse phase clock and being capable of switching a signal path in response to the number of clock cycles, and first and second control means which controls counting of the clock cycles equivalent to the even or odd number latency by forming an appropriate signal path.

8 Claims, 12 Drawing Sheets

SYNCHRONOUS SEMICONDUCTOR MEMORY DEVICE

BACKGROUND OF THE INVENTION

1. Field of the Invention

This invention relates to a synchronous semiconductor memory device which operates in synchronization with a clock, and particularly relates to a synchronous semiconductor memory device having a configuration for controlling operation timings corresponding to a latency after an issuance of a command for various purposes.

2. Description of the related art

Recently SDRAM (Synchronous Dynamic Random Access Memory) of DDR (Double Data Rate) type has been a mainstream as a synchronous semiconductor memory device to allow high speed operation. Since this DDR-SDRAM (referred to as DDR-SDRAM hereinafter) employs a high speed clock, a considerable number of clock cycles are required between issuing a command and completion of a data transmission in read/write operation. Therefore, a configuration is employed in which a predetermined number of clock cycles of an external clock is preliminarily set as a latency based on operation of the DDR-SDRAM and a latency counter is provided to count the set latency based on an internal clock (for example JP-A-2002-230973). In the DDR-SDRM, different latencies are defined for various types of operation and users can preset a desired latency in a mode register. Further, with progress of the DDR-SDRAM generation, speed of the external clock increases and the required latency tends to gradually increase. Under the circumstances, a configuration of the latency counter of the DDR-SDRAM is required, in which the number of clock cycles can be counted in a wide range and selectively output.

FIG. 11 shows an example of a configuration of the latency counter applied to the above mentioned conventional DDR-SDRAM. FIG. 12 shows operation waveforms at each part of the latency counter of FIG. 11. The latency counter shown in FIG. 11 is composed of D flip flops (D-F/F) 101 to 109 functioning as a shift register of nine stages, selectors 110 and 111, an OR circuit 112, and a D flip flop 113 on the output side. Shifting operation of each of the D flip flops 101 to 109 and 113 is controlled at rising edges of an internal clock PCLK. This internal clock PCLK is generated based on the external clock having a period tCK and has the same period tCK.

In the first stage D flip flop 101, a command signal COM output from a command decoder is input when a predetermined external command is input. As shown in FIG. 12, the command signal COM is a pulse which rises with slight delay from first cycle T0 at which the external command is captured. A signal F1 to which the command signal COM is shifted one period tCK is output from the first stage D flip-flop 101 and is input to the second D flip-flop 102 in a period of cycle T1. Similarly, signals F2 to F9 to which the command signal COM shifted one by one period tCK in order are output from the D flip flops 102 to 109 of the second to ninth stages and are input to the subsequent stages in periods of cycles T2 to T9 sequentially.

The signals F2 to F5 of the D flip flops 102 to 105 of the second to fifth stages are input to the selector 110. The signals F6 to F9 of the D flip flops 106 to 109 of the sixth to ninth stages are input to the selector 111. A control signal Ca is input to a selector 31 and a control signal Cb is input to a selector 32, each of which functions as a control signal for selecting a predetermined latency. One of eight signals F2 to F9 is selected and output in response to these control signals Ca and Cb. Controls for selecting one of the eight signals F2 to F9 corresponds to settings of latencies 4 to 11 respectively.

In the example of FIG. 12, a case is shown in which the signal F5 of the fifth stage D flip flop 105 is selected and output by the selector 110 corresponding to a setting of latency 7. Therefore, the signal F5 is input to the OR circuit 112 from the D flip flop 105 through the selector 110, and a signal OR is output from the OR circuit 112. The signal OR which rises in the period of cycle T5 is input to the D flip flop 113 on the output side to be shifted one period tCK, and a signal Sout which rises in the period of cycle T6 is output. This signal Sout is output to the next stage circuit, and a latency equivalent to 7tCK from cycle T0 to cycle T7 can be counted by controlling using a rising edge of the subsequent cycle T7.

In FIG. 11, in cases of counting different latencies, basic operations are the same. When the minimum latency 4 is set, the signal F2 of the second stage D flip flop 102 is selected and output by the selector 110, and a latency equivalent to 4tCK from cycle T0 to cycle T4 is counted. When the maximum latency 11 is set, the signal F9 of the final stage D flip flop 109 is selected and output by the selector 111, and a latency equivalent to 11tCK from cycle T0 to cycle T11 is counted.

However, in the above-mentioned operation of the conventional latency counter, since an operation frequency of the D flip flops 101 to 109 conforms to the external clock frequency, consumption current of the nine-stage shift register increases. That is, since the internal clock having the same frequency as the external clock is applied to each stage of the nine-stage shift register, sequential shift operation of each stage performed at every period tCK of the external clock causes a problem of an increase in the entire consumption current. In this case, it is a problem that as the speed of the external clock increases, the consumption current rapidly increases. And since the minimum period tCKmin of the external clock is restricted by circuit operation such as transfer speed of the shift register, sufficient operation margin can not be secured, which may also cause a problem of high speed.

BRIEF SUMMARY OF THE INVENTION

It is an object of the present invention to provide a synchronous semiconductor memory device having a configuration in which a rapid increase in consumption current is suppressed when using the high-speed external clock, sufficient margin for the operation timings in using the external clock is secured without being restricted by circuit operation, and various latencies which can be selectively set are reliably counted.

An aspect of the present invention is a synchronous semiconductor memory device comprising: a clock generator for generating a normal phase clock and a reverse phase clock with a phase difference of 180 degree therebetween as internal clocks by dividing an external clock having a predetermined period; a command decoder for decoding an external command and outputting a command signal in accordance with a decoding result; latency setting means capable of selectively setting an even number latency having a period of an even number times the period of said external clock or an odd number latency having a period of an odd number times the period of said external clock within a range of a predetermined number of clock cycles of said external clock; a latency counter which includes a first counter circuit for sequentially shifting said command signal captured using said normal phase clock and being capable of sequentially switching a signal path in response to said number of clock cycles and a second counter circuit for sequentially shifting said command signal captured using said reverse phase clock and being capable of switching a signal path in response to said number of clock cycles; first control means which, when said even number latency is set, controls counting of said clock cycles equivalent to said even number latency by forming a signal path such that said command signal captured using said normal phase clock passes only through said first counter circuit and said command signal captured using said reverse phase clock passes only through said second counter circuit; second control means which, when said odd number latency is set, controls counting of said clock cycles equivalent to said odd number latency by forming a signal path such that said command signal captured using said normal phase clock is shifted from said first counter circuit to said second counter circuit and said command signal captured using said reverse phase clock is shifted from said second counter circuit to said first counter circuit.

According to the aspect of the synchronous semiconductor memory device of the present invention, when counting various latencies corresponding to the external command, internal clocks into which the external clock is divided by two can be used, so that operation frequency becomes half of that of the high-speed external clock. Thus, effects of a decrease in consumption current and an increase in margin of the operation timing can be obtained. And when set latency is changed in detail, since a single counter circuit can count only even number latencies, two counter circuits provided in parallel enables a configuration for counting odd number latencies. In this case, a configuration is employed in which by using the normal phase clock and the reverse phase clock which are the internal clocks having a phase difference of 180 degree therebetween, the first counter circuit operates using the normal phase clock while the second counter circuit operates using the reverse phase clock, and a signal path is appropriately switched in response to the number of the clock cycles to be counted. Thereby, various latencies can be counted within a relatively wide range, regardless of whether the number is even or odd. Accordingly, a synchronous type semiconductor memory device which can count desired latencies adapting to command types or operation conditions with low consumption current can be realized.

In the present invention, said first and second counter circuits may have a symmetrical circuit configuration using the same constituents.

In the present invention, each of said first and second counter circuits may include an N-stage shift register circuit for sequentially shifting said command signal.

In the present invention, each of said first and second counter circuits may include a first selector to which said command signal and signals of respective stages of said shift register circuit are input and which passes a signal selected from the N+1 signals and a second selector to which said command signal and signals of respective stages of said shift register circuit are input and which passes a signal selected from the N+1 signals to be shifted to the other counter circuit.

In the present invention, each of said first and second counter circuits may include an output-side circuit connected to said first selector and to said second selector of said other counter circuit, and a delay time of a signal path through said second circuit and said output-side circuit may be one period of said external clock longer than that of said signal path through said first circuit and said output-side circuit.

In the present invention, 2(N+1) said latencies including N+1 even number latencies within a range from minimum M (even number) and maximum M+2N, and N+1 odd number latencies within a range from minimum M+1 to maximum M+1+2N can be selectively counted in said latency counter.

In the present invention, said latency setting means may include a mode register for storing a set latency rewritably, and switching of said signal path may be controlled by the set latency stored in said mode register.

In the present invention, a plurality of latencies corresponding to s standard of DDR-SDRAM can be counted in said latency counter.

As described above, according to the present invention, when using the internal clocks into which the external clock is divided to count the set latency, the latency counter including the first counter circuit and the second counter circuit is provided so as to form a signal path which is shifted therebetween, and therby various latencies can be selectively counted regardless of whether the number is even or odd. And when using the high-speed external clock, the latency counter operates with the internal clocks having a half frequency, and thus a decrease in consumption current and an increase in margin of the operation timing can be realized. Further, when the set latency is changed, it is possible to control easily and immediately, and by providing many latency counters individually corresponding to external command types and operation conditions, it is possible to facilitate adjustment of operation timings in the entire semiconductor memory device.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Embodiments of the present invention will be described hereinafter with reference to accompanying drawings. In this embodiment, a synchronous semiconductor memory device to which the present invention applied is, for example, a DDR-SDRAM having a latency counter for counting latencies set for various commands.

Figure 1:
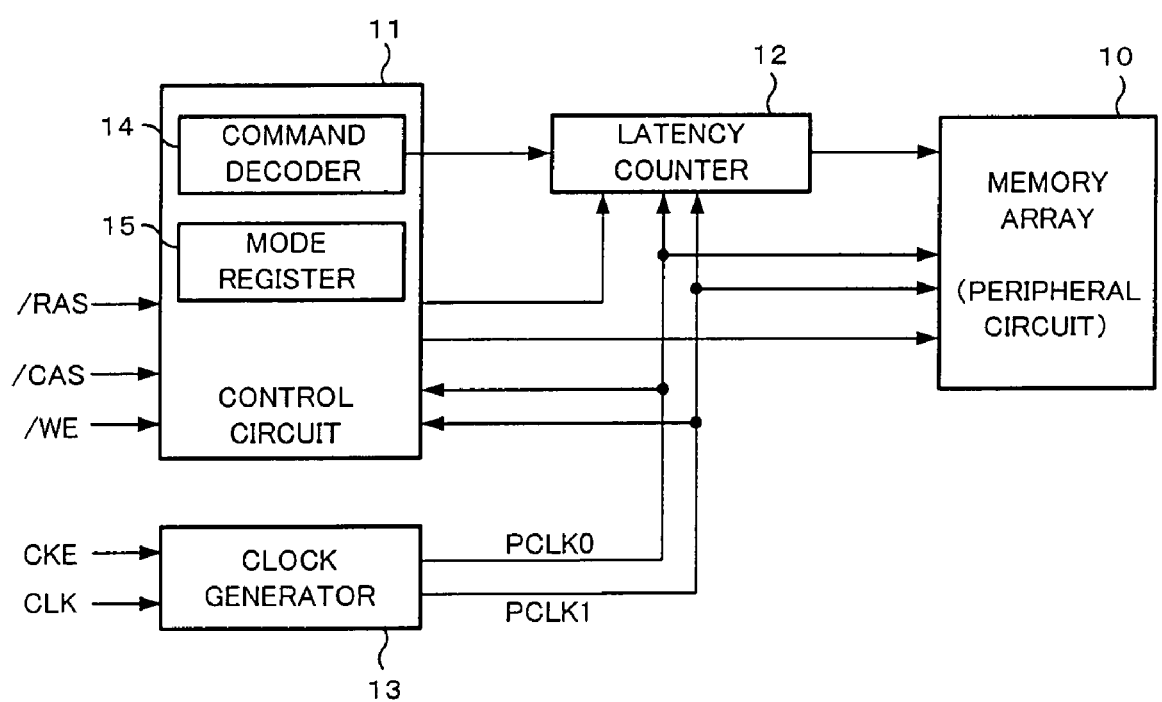
FIG. 1 is a block diagram showing a principal configuration of a synchronous semiconductor memory device of an embodiment.

FIG. 1 is a block diagram showing a principal configuration of a synchronous semiconductor memory device of this embodiment. The synchronous semiconductor memory device as shown in FIG. 1 includes a memory array 10, a control circuit 11, a latency counter 12, and a clock generator 13. Actually the synchronous semiconductor memory device includes many other components, but only components related to the function based on the present invention are shown in FIG. 1.

In the above-mentioned configuration, the memory array 10 includes a plurality of memory cells formed at intersections of a plurality of word lines and a plurality of bit lines arranged in a matrix, and a read/write operation is performed with respect to the memory cells corresponding to a designated address. Peripheral circuits required for selecting operations of word lines and bit lines are added to the memory array 10. The control circuit 11 controls the entire operation of the synchronous semiconductor memory device of this embodiment and sends control signals to each part. The control circuit 11 functions as first control means and second control means of the present invention.

The control circuit 11 has a command decoder 14 which decodes input external commands and outputs command signals corresponding to command types of the decoding result, and a mode register 15 which stores operation modes capable of being set for the synchronous semiconductor memory device. The external commands are defined correspondingly to combination patterns of various control signals (row address strobe signal /RAS, column address strobe signal /CAS, and write enable signal /WE) input from outside to the control circuit 11.

In the synchronous semiconductor memory device of this embodiment, the latency counter 12 is a circuit for counting number of clock cycles equivalent to the latency set according to the operation specified by the command signal. Generally the latencies according to operations are stored in the mode register 15 by setting from outside. The mode register 15 functions as latency setting means of the present invention. For examples, a CAS latency specifying the timing of data output in response to a read command and a write latency specifying the timing of data input in response to a write command are used. These latencies can be selectively set arbitrary values within a predetermined range by a set command for the mode register 15. Therefore, the number of clock cycles to be counted by the latency counter 12 is required to be variably controlled according to the type of the latency and the settable range. Detailed configuration and operation of the latency counter 12 will be described later.

Although, a single latency counter 12 is shown in FIG. 1, a plurality of latency counters 12 maybe provided correspondingly to command types or the like. Further, two latency counters 12 may be connected in cascade so as to count a latency obtained by adding two different latencies. For example, a configuration can be employed in which a latency counter 12 for the above-mentioned CAS latency (CL) and a latency counter 12 for an additive latency (AL) added to the CAS latency are connected in cascade so as to count a read latency (RL=CL+AL).

The clock generator 13 generates a normal phase clock PCLK0 and a reverse phase clock PCLK1 based on the input external clock CLK, which are two internal clocks into which the external clock CLK is divided. The normal phase clock PCLK0 and the reverse phase clock PCLK1 have a relation in which a phase difference therebetween is 180 degree. And the normal phase clock PCLK0 and the reverse phase clock PCLK1 have a period 2tCK twice the period tCK of the external clock CLK. As shown in FIG. 1, the normal phase clock PCLK0 and the reverse phase clock PCLK1 are sent to the memory array 10, the control circuit 11 and the latency counter 12 respectively from the clock generator 13 to control operation timings. The clock enable signal CKE input to the clock generator 13 from outside is a signal for determining whether the external clock CLK is valid or invalid.

Figure 2:
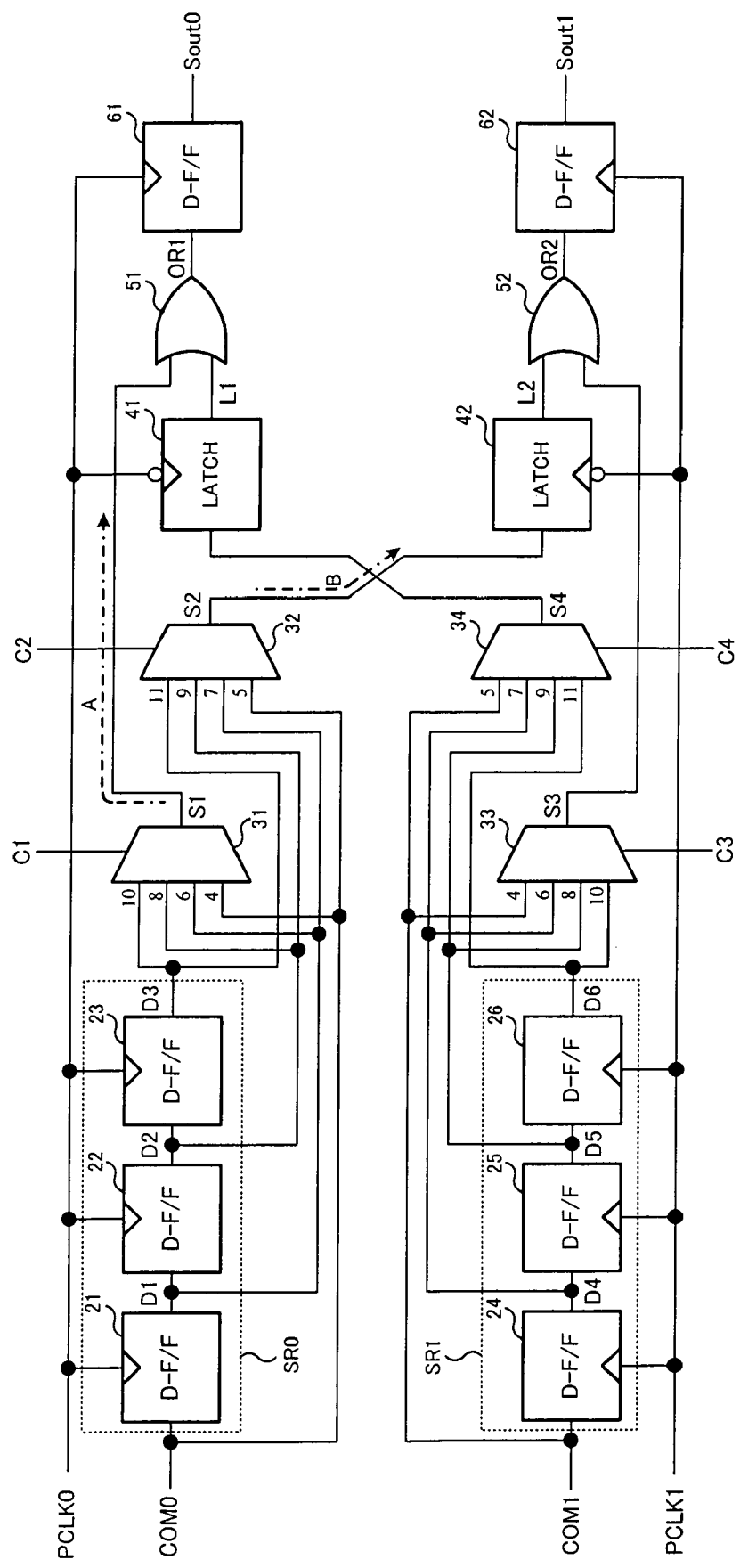
FIG. 2 a diagram showing a detailed configuration of the latency counter of FIG. 1.

Next, the configuration and operation of the latency counter 12 in the FIG. 1 will be described in detail. FIG. 2 is a diagram showing a detailed configuration of the latency counter 12 of FIG. 1, and FIGS. 3 to 6 are diagrams showing examples of operation waveforms at each part of the latency counter 12 of FIG. 2. The latency counter 12 shown in FIG. 2 can count eight steps of latencies 4 to 11 arbitrarily within a range from the minimum latency 4 to the maximum latency 11, and includes D flip flops 21 to 26, selectors 31 to 34, L hold latches 41, 42, OR circuits 51, 52 and D flip flops 61, 62 on the output side.

The normal phase clock PCLK0 and the reverse phase clock PCLK1 from the clock generator 13 are applied to the latency counter 12. As shown in FIG. 1, the normal phase clock PCLK0D is applied to D flip flops 21 to 23 and 61, while the reverse phase clock PCLK1 is applied to D flip flops 24 to 26 and 62. An inverted signal of the normal phase clock PCLK0 is applied to the L hold latch 41, while an inverted signal of the reverse phase clock PCLK0 is applied to the L hold latch 42.

As shown in FIG. 2, D flip flops 21 to 23 to which the normal phase clock PCLK0 is applied form a three-stage shift register SR0, while D flip flops 24 to 26 to which the reverse phase clock PCLK1 is applied form a three-stage shift register SR1. A command signal COM0 is input to the first-stage D flip flop 21 of one shift register SR0, while a command signal COM1 is input to the first-stage D flip flop 24 of the other shift register SR1. When an external command is input, either one of the command signals COM0 and COM1 is output in response to the cycle of the external clock CLK in the command decoder 14.

As shown in FIG. 2, the latency counter 12 has a symmetrical circuit configuration between upper and lower sides. The upper shift register SR0, the selectors 31, 32, the L hold latch 41, the OR circuit 51 and the D flip flop 61 form a first counter circuit of the present invention. The lower shift register SR1, the selectors 33, 34, the L hold latch 42, the OR circuit 52 and the D flip flop 62 form a second counter circuit of the present invention.

Figure 3:
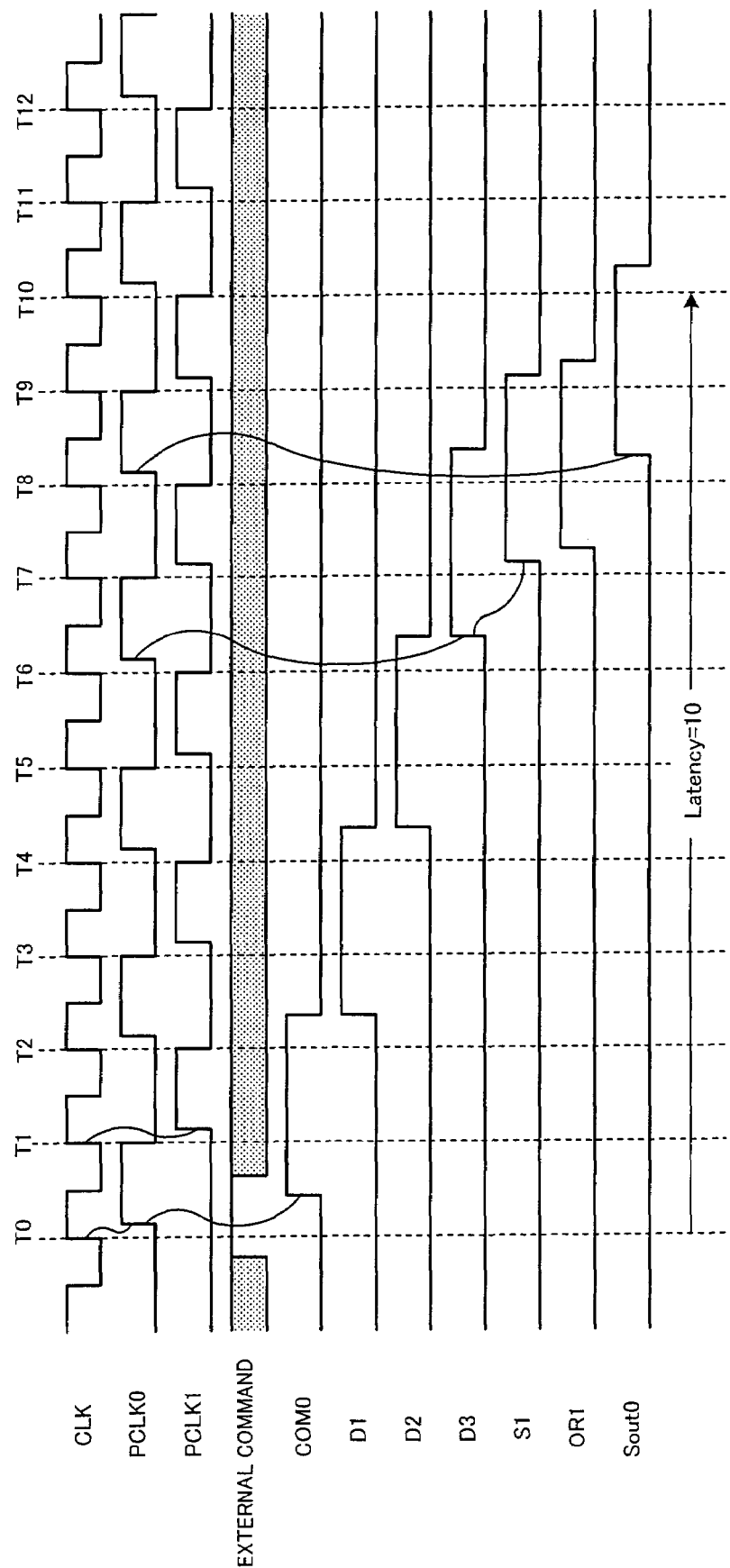
FIG. 3 is a diagram showing operation waveforms at each part of the latency counter in a case in which the signal path for the maximum even number latency 10 is formed in the latency counter.

A counting operation of the latency counter 12 in a case in which a signal path for an even number latency is formed will be described with reference to FIGS. 3 and 4. FIG. 3 shows an example of operation waveforms corresponding to a setting of the maximum even number latency 10. As shown in FIG. 3, the command signal COM0 corresponding to the external command captured by the normal phase clock PCLK0 at cycle T0 should be input. The command signal COM0 is a pulse which rises slightly delayed from a rising edge of the normal phase clock PCLK0 in the period of cycle T0 and is held high only in the period 2tCK. The first stage D flip flop 21 outputs a signal D1 to which the input command signal COM0 is shifted one period tCK of the normal phase clock PCLK0. Here, since the period of the normal phase clock PCLK0 is twice the period tCK of the external clock CLK, the signal D1 is a pulse to which the command signal COM0 is shifted 2kCK. Similarly, the second stage D flip flop 22 outputs a signal D2 to which the signal D1 is shifted 2tCK, and the third stage D flip flop 23 outputs a signal D3 to which the signal D2 is shifted 2tCK. Based on the command signal COM0 as a reference, the signals D1, D2 and D3 of respective stages of the shift register SR0 are sequentially shifted at timings of 2tCK, 4tCK and 6tCK.

As shown in FIG. 2, the command signal COM0 and signals D0, D1, D2 of the stages of the shift register SR0 are input to each of the selectors 31 and 32. The selector 31 forms a signal path corresponding to the even number latencies (latencies 4, 6, 8, 10), and the selector 32 forms a signal path corresponding to the odd number latencies (latencies 5, 7, 9, 11). Values of the latencies 4 to 11 are denoted on the input sides of the selectors 31 and 32, so that the relation between the set latencies and the signal paths is represented. Hereinafter, counting operations for the maximum even number latency 10 and the minimum latency 4 among eight steps of latencies will be described. Counting operations for the odd number latencies will be described later.

In the operation of FIG. 3, a control signal C1 corresponding to the signal path for the maximum even number latency 10 must be supplied to the selector 31. Thereby the selector 31 is controlled so that the signal D3 output from the D flip flop 23 is selectively passed. Since delay of the selector 31 is considerably large, a signal S1 which delays nearly one period relative to the input signal D3 and rises at cycle T7 is obtained. The signal S1 output from the selector 31 is input to one end of the OR circuit 51 (in an arrow A direction).

A signal L1 output from the L hold latch 41 is input to the other end of the OR circuit 51. When the selector 31 is in the selected state as shown in FIG. 3, the selector 34 is in the non-selected state, and thereby the L hold latch 41 does not output a signal. Thus, a signal OR1 slightly delayed relative to the signal S1 is output from the OR circuit 51. And the signal OR1 output from the OR circuit 51 is input to the D flip flop 61 on the output side. The D flip flop 61 outputs a signal Sout0 as a pulse synchronizing with a rising edge at cycle T8 of the normal phase clock PCLK0. As shown in FIG. 3, the signal Sout0 from the D flip flop 61 is output to the next stage circuit, and is used at the subsequent cycle T10 of the normal phase clock PCLK0. Thereby a latency equivalent to 10tCK from cycle T0 to cycle T10 is counted.

Figure 4:
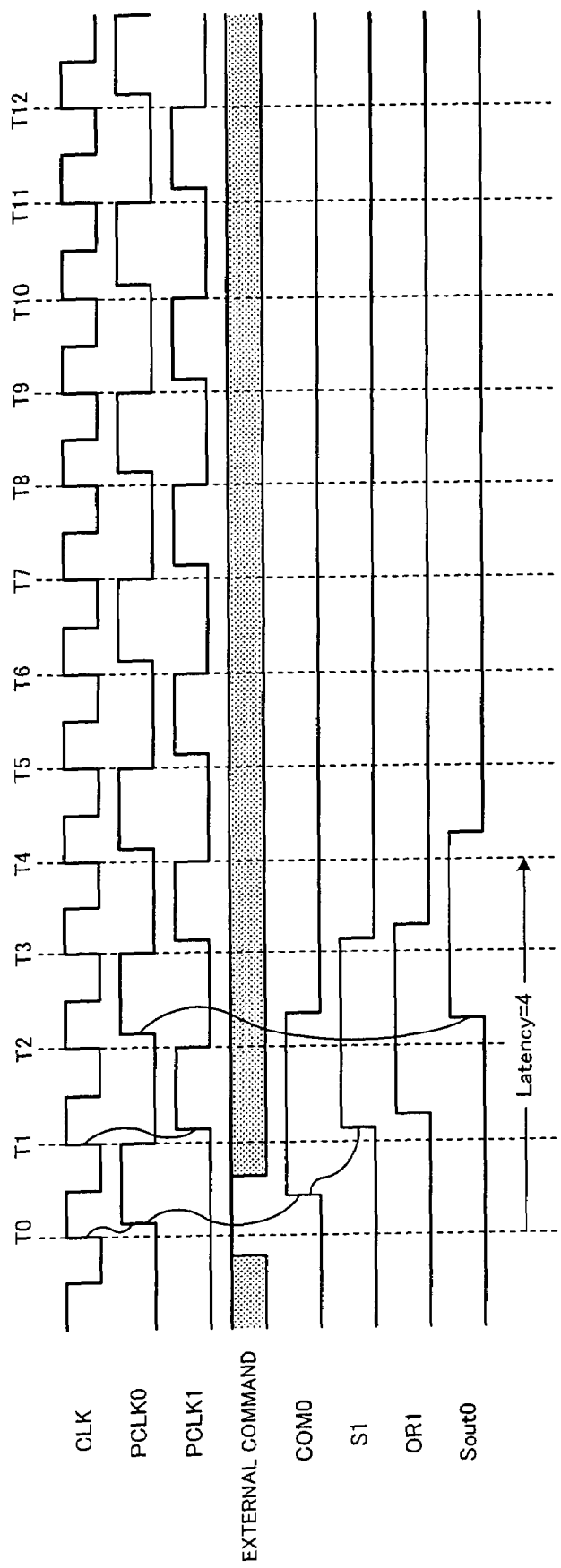
FIG. 4 is a diagram showing operation waveforms at each part of the latency counter in a case in which the signal path for the minimum even number latency 4 is formed in the latency counter.

Although in the above-mentioned example of FIG. 3, the case of forming the signal path for the maximum even number latency 10 is shown, FIG. 4 shows an example of operation waveforms at each part of the latency counter 12 corresponding to a setting of the minimum even number latency 4. In the operation of FIG. 4, the control signal C1 corresponding to the signal path for the minimum even number latency 4 must be supplied to the selector 31. Thereby the selector 31 is controlled so that the command signal COM0 is selectively passed, and the signal S1 which is delayed nearly one period relative to the command signal COM0 and rises at cycle T1 is output from the selector 31. It is found that the rising timing of the signal S1 of FIG. 4 is six cycles earlier than that of FIG. 3.

In FIG. 4, subsequent operation is performed in the same manner as the operation in FIG. 3, and the signal Sout0 is output through the OR circuit 51 and the D flip flop 61. In this case, the operation waveforms of FIG. 4 is obtained by assuming that timings being six cycles earlier than FIG. 3 due to a difference in signal paths to the selector 31. In this manner, a latency equivalent to 4tCK from cycle T0 to cycle T4 can be counted using the signal Sout0 output to the next stage.

In a case in which other even number latency 6 or 8 is set, the same operation may be performed. The signal D1 is passed for the even number latency 6 and the signal D2 is passed for the even number latency 8 by selective control of the selector 31 respectively. Thereby, a latency equivalent to 6tCK from cycle T0 to cycle T6 is counted for the even number latency 6, and a latency equivalent to 8tCK from cycle T0 to cycle T8 is counted for the even number latency 8.

On the other hand, counting operation in which the command signal COM1 corresponding to the external command captured by the reverse phase clock PCLK1 is input and the shift register SR1 is used may be performed in the same manner as in FIGS. 3 and 4. For example, if the command signal COM1 rising at cycle T1 is input, each part is assumed to be replaced with each other and operation waveforms delayed 1tCK is assumed in FIGS. 3 and 4 based on the symmetry of the circuit (upper and lower sides in FIG. 2).

Figure 5:
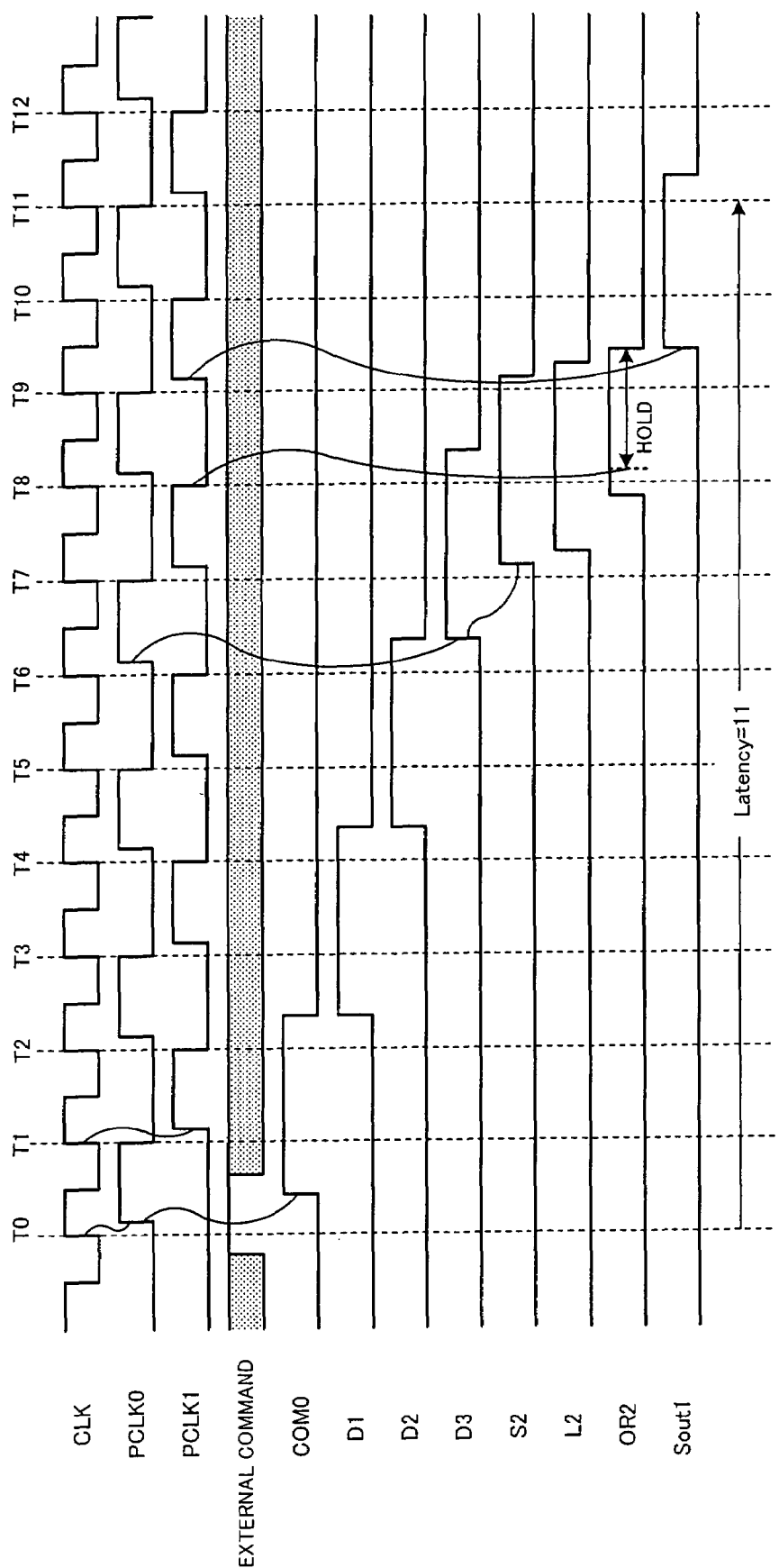
FIG. 5 is a diagram showing operation waveforms at each part of the latency counter in a case in which the signal path for the maximum odd number latency 11 is formed in the latency counter.

Next, an operation of the latency counter 12 in a case in which a signal path for an odd number latency is formed will be described with reference to FIGS. 5 and 6. FIG. 5 shows an example of operation waveforms of each part of the latency counter 12 corresponding to a setting of the maximum odd number latency 11. As shown in FIG. 5, the external command is input at the same timing as that of FIG. 3. In this case, the operation waveforms of command signal COM0 and signals D1, D2, D3 in the shift register SR0 are the same as in FIG. 3.

On the other hand, the control signal C1 corresponding to the non-selected state must be supplied to the selector 31, and a control signal C2 corresponding to the signal path of the maximum odd number latency 11 must be supplied to the selector 32. Thereby the selector 32 is controlled so that the signal D3 output from the D flip flop 23 is selectively passed. As shown in FIG. 5, a signal S2 which changes at the same timing as the signal S1 of FIG. 3 is output from the selector 32.

As shown in the configuration of FIG. 2, the signal path of the even number latency is shifted to the signal path of the odd number latency on the output side of the selector 32 (in an arrow B direction). That is, the signal S2 output from the selector 32 is input to the lower side L hold latch 42. In this manner, control is performed so that each signal is passed through the selector 31 in the case of forming the signal path of the even number latency, while each signal is passed through the selector 32 in the case of shifting from the signal path of the even number latency to the signal path of the odd number latency.

In the L hold latch 42, the input signal S2 is latched in synchronization with a rising edge at cycle T7 of the reverse phase clock PCLK1. At this time, a signal L2 output from the L hold latch 42 goes high, and this state is maintained until a subsequent rising edge of the reverse phase clock PCLK1. Thus, the signal L2 changes from high to low in synchronization with a rising edge at cycle T9 of the reverse phase clock PCLK1.

In the OR circuit 52, the signal L2 output from the L hold latch 42 is input to one end, and the signal S3 output from the selector 33 is input to the other end. In this case, since the selector 33 is in the non-selected state, a signal OR2 slightly delayed relative to the signal L2 is output from the OR Circuit 52. Then the signal OR2 output from the OR circuit 52 is input to the D flip flop 62 on the output side. The D flip flop 62 outputs a signal Sout1 as a pulse synchronizing with a rising edge at cycle T9 of the reverse phase clock PCLK1. As shown in FIG. 5, the signal Sout1 form the D flip flop 62 is output to the next stage circuit and is used at the subsequent cycle T11 of the reverse phase clock PCLK1. Thereby a latency equivalent to 11tCK from cycle T0 to cycle 11 is counted.

As described above, in the latency counter 12 of this embodiment, the signal path of the even number latency is controlled to be shifted to the signal path of the odd number latency, so that a desired odd number latency can be counted. That is, in the case of using only the normal-phase clock PCLK0, its period is set to twice the period of the external clock, and thus only a latency an even number times the period tCK can be counted. On the contrary, since the normal-phase clock PCLK0 can be switched to the reverse phase clock PCLK1 in the middle of counting operation by the shifting of the signal paths in this embodiment, a latency an odd number times the period tCK can be counted.

Figure 6:
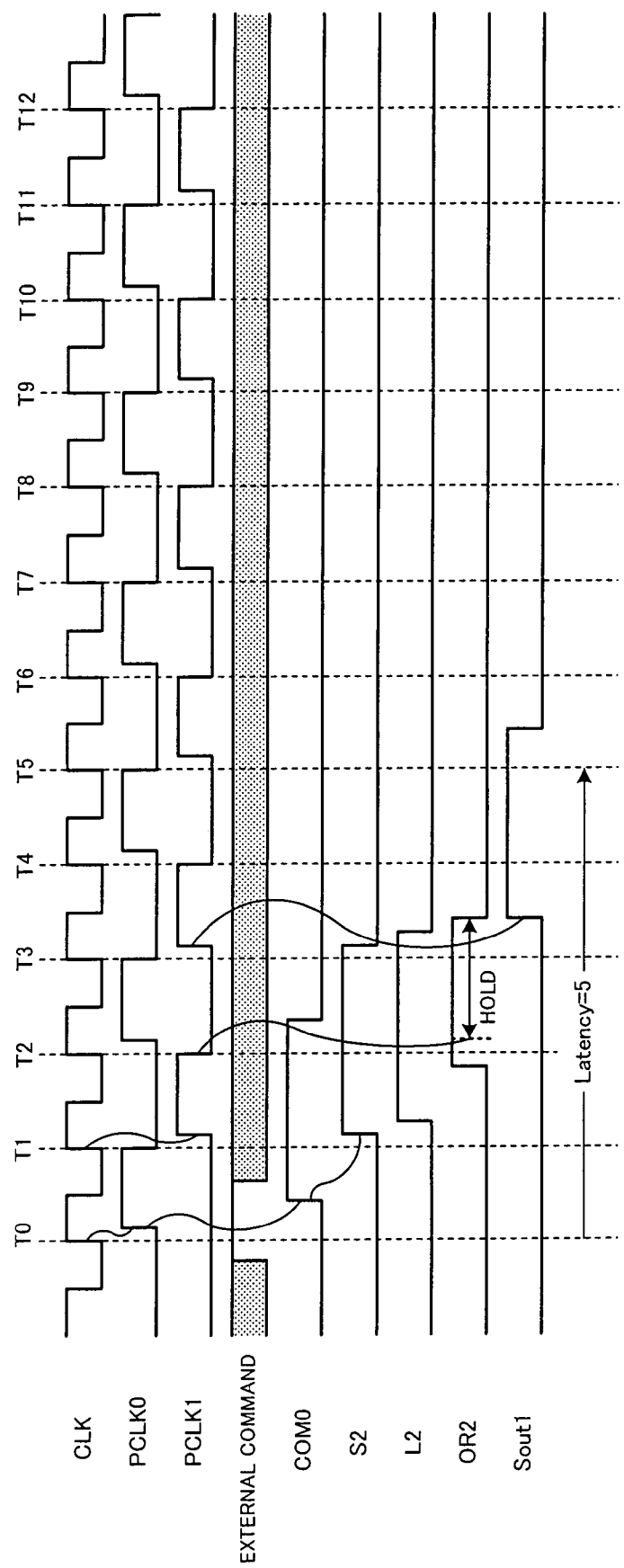
FIG. 6 is a diagram showing operation waveforms at each part of the latency counter in a case in which the signal path for the minimum odd number latency 5 is formed in the latency counter.

Although in the above-mentioned example of FIG. 5, the case of forming the signal path for the maximum odd number latency 11 is shown, FIG. 6 shows an example of operation waveforms at each part of the latency counter 12 corresponding to a setting of the minimum odd number latency 5. In the operation of FIG. 6, the control signal C2 corresponding to the signal path for the minimum odd number latency 5 must be supplied to the selector 32. Thereby the selector 32 is controlled so that the command signal COM0 is selectively passed, and the signal S2 which is delayed nearly one period relative to the command signal COM0 and rises at cycle T1 is output from the selector 32. It is found that the rising timing of the signal S2 of FIG. 6 is six cycles earlier than that of FIG. 5.

In FIG. 6, as described above, after shifting to the signal path of the odd number latency on the output side (in the arrow B direction in FIG. 2), following the same operation as in FIG. 5, the signal Sout1 is output through the L hold latch 42, the OR circuit 52, and the D flip flop 62 on the output side. In this case, the operation waveforms of FIG. 6 is obtained by assuming that timings being six cycles earlier than FIG. 5 due to a difference in signal paths to the selector 32. In this manner, a latency equivalent to 5tCK from cycle T0 to cycle T5 can be counted using the signal Sout1 output to the next stage.

In a case in which other odd number latency 7 or 9 is set, the same operation may be performed. The signal D1 is passed for the odd number latency 7 and the signal D2 is passed for the odd number latency 9 by selective control of the selector 31 respectively. Thereby, a latency equivalent to 7tCK from cycle T0 to cycle T7 is counted for the odd number latency 7, and a latency equivalent to 9tCK from cycle T0 to cycle T9 is counted for the odd number latency 9.

On the other hand, counting operation in which the command signal COM1 corresponding to the external command captured by the reverse phase clock PCLK1 is input and the shift register SR1 is used may be performed in the same manner as in FIGS. 5 and 6. In this case, shifting of the signal paths from the even number latency to the odd number latency is performed so as to form a signal path from the selector 34 to the L hold latch 41 of FIG. 3 (in the direction crossing the arrow B direction in FIG. 2). For example, if the command signal COM1 rising at cycle T1 is input, each part is assumed to be replaced with each other and operation waveforms delayed 1tCK is assumed in FIGS. 5 and 6 based on the symmetry of the circuit (upper and lower sides in FIG. 2).

As described above, in the latency counter 12 of this embodiment, eight steps of latencies can be selectively counted within a range from the minimum latency 4 to the maximum latency 11 regardless of whether the number is even or odd. Here, a more general configuration of the latency counter 12 is considered, in which N-stage shift registers SR0 and SR1 are formed and a delay time M times (M: even number) the period tCK is added to the shifting operation. This configuration enables counting N+1 even number latencies which change in order of M, M+2 to M+2N and N+1 odd number latencies which change in order of M+1, M+3 to M+1+2N, and together with these, selectively counting latencies of 2 (N+1) steps within a range from M to M+1+2N. The latency counter 12 of FIG. 2 corresponds to a case of M=4 and N=3.

In the latency counter 12 of this embodiment, since the internal clocks (the normal phase clock PCLK0 and the reverse phase clock PCLK1) having the period 2tCK twice the period of the external clock CLK are used without directly using the external clock CLK in the counting operation, thereby reducing the consumption current. That is, since the operating frequency of the internal clock is half that of the external clock CLK, the consumption current required for each shifting operation is reduced to half. And since the circuit scale is almost the same as the conventional configuration, the entire consumption current is also reduced to half. Further, even in the case of using the high-speed external clock CLK, the internal clock having half of the operating frequency can be used in the counting operation of the latency counter 12, and thus the operation timing margin can be expanded to an appropriate range.

Here, the latency counter 12 of this embodiment has an effect in terms of the operation speed in addition to the above-mentioned effect in which the consumption current is reduced to half based on the shifting operation according to the period 2tCK. Since shifting of signal paths is not required when setting the even number latency, high-speed operation in 1 tCK is not required and there is an effect of reducing the operation speed by the shifting operation by 2tCK. Meanwhile, since the signal path is shifted when setting the odd number latency, switching operation between the normal-phase clock PCLK0 and the reverse phase clock PCLK1 is required and the operation of 1tCK is required at the switching timing. In the configuration of this embodiment, as shown in FIG. 2, the selectors 31 to 34 requiring operation for a long time are not associated with the clock switching when shifting the signal path, but a single latch and a single stage gate (L hold latches 41, 42, OR circuits 51, 52) are associated therewith, and thereby having the advantage in the operation speed.

Figure 7:
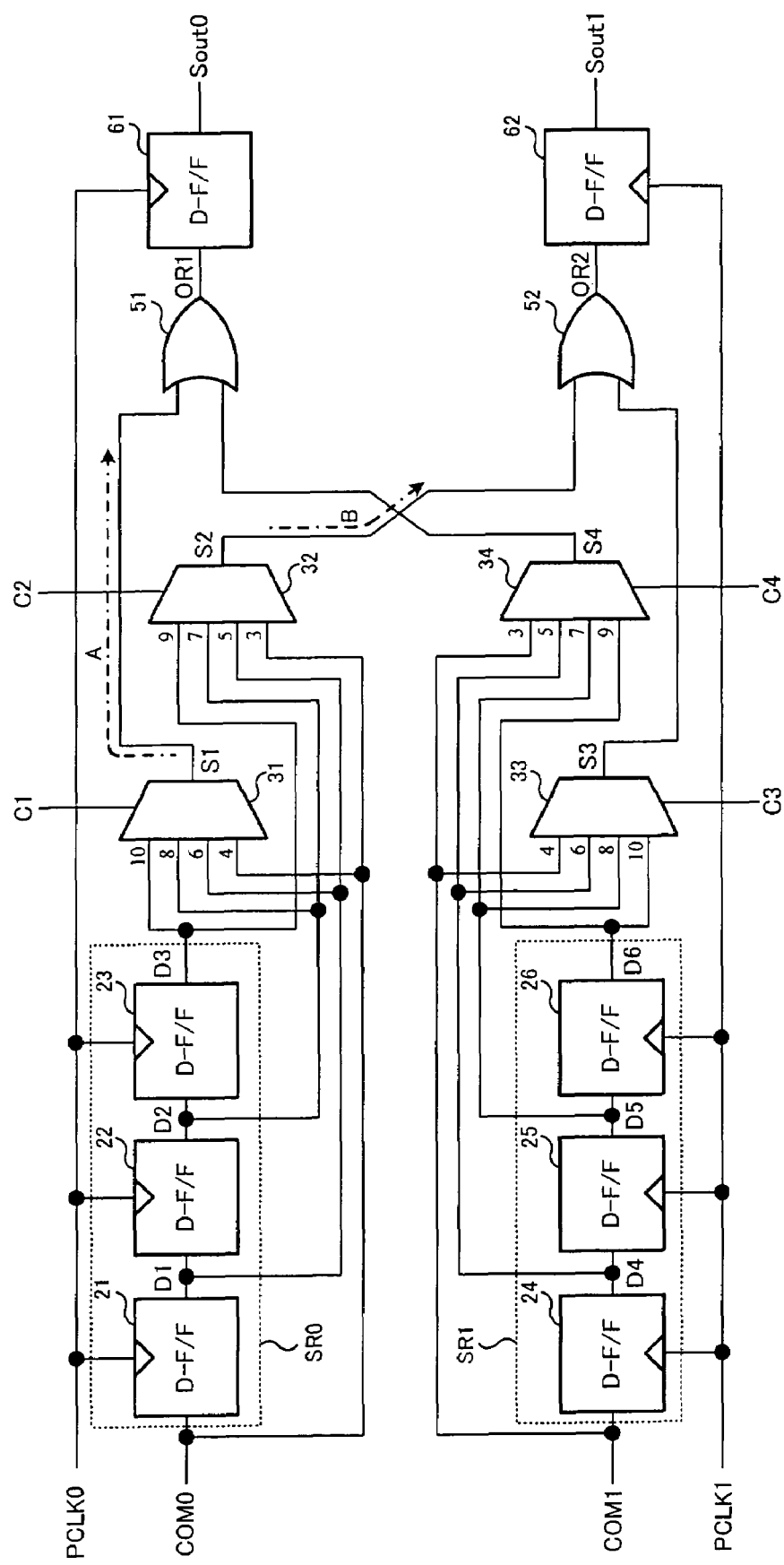
FIG. 7 is a diagram showing a configuration in which L hold latches are not provided in the latency counter of FIG. 2 in order to describe the effect concerning the operation speed.
Figure 8:
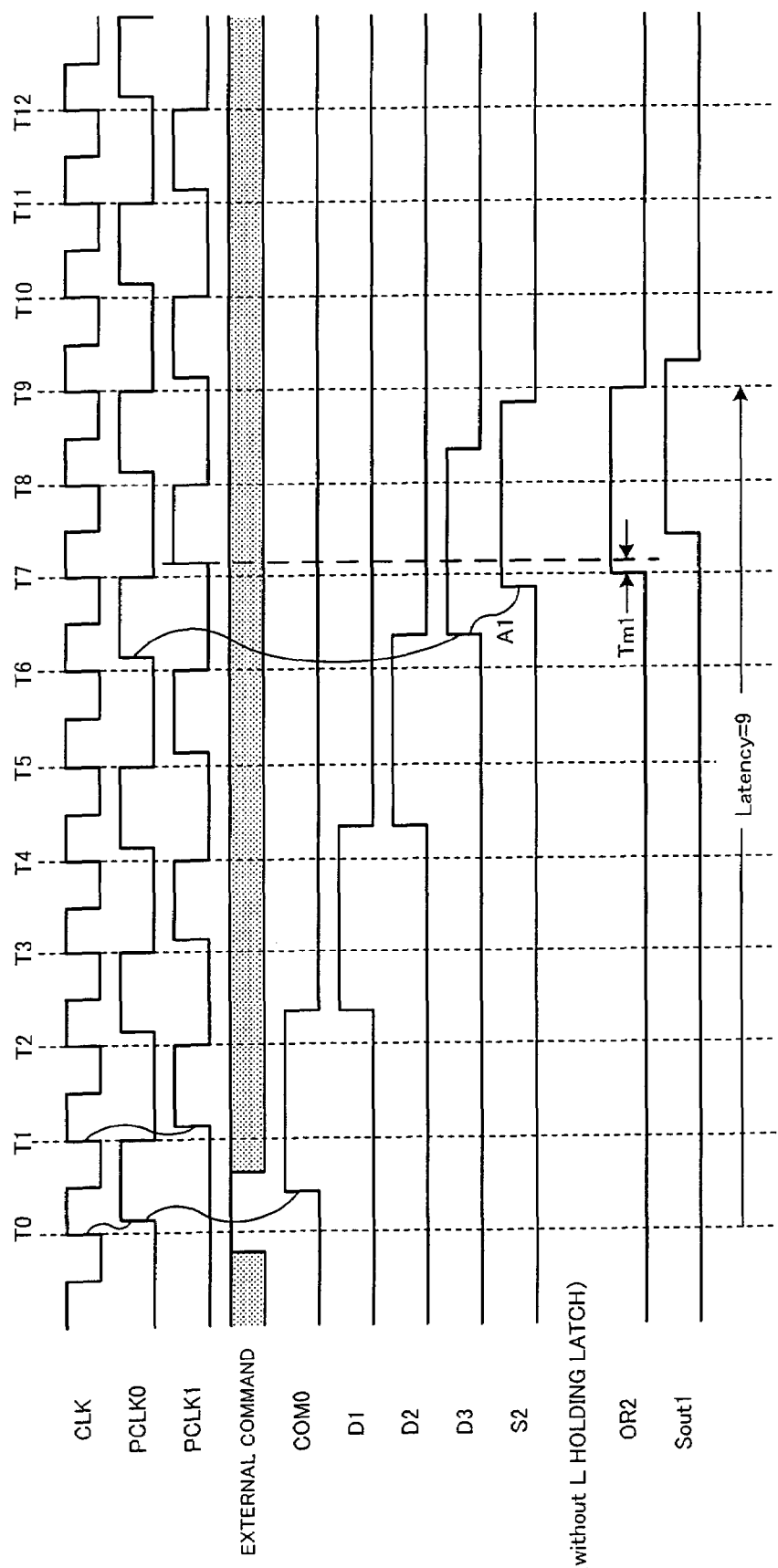
FIG. 8 is a diagram showing operation waveforms at each part of the latency counter corresponding to the setting of the odd number latency 9 in FIG. 7.

FIG. 7 shows a configuration in which the L hold latches 41 and 42 are not provided in the latency counter 12 of FIG. 2, in order to describe the above-mentioned effect concerning the operation speed. And FIG. 8 shows operation waveforms at each part of the latency counter 12 corresponding to the setting of the odd number latency 9 in FIG. 7. As shown in FIG. 8, the signal D3 from the third stage D flip flop 23 is output through the selector 32 in a range from cycle T6 to cycle T7 (refer to A1 in the FIG), and thereafter the signal path is shifted and then the signal D3 is input to the OR circuit 52. When the latency 9 is obtained in the D flip flop 62 on the output side, timing margin Tm1 between rising edges of the signal OR2 from the OR circuit 52 and the reverse phase clock PCLK1 becomes very small.

Figure 9:
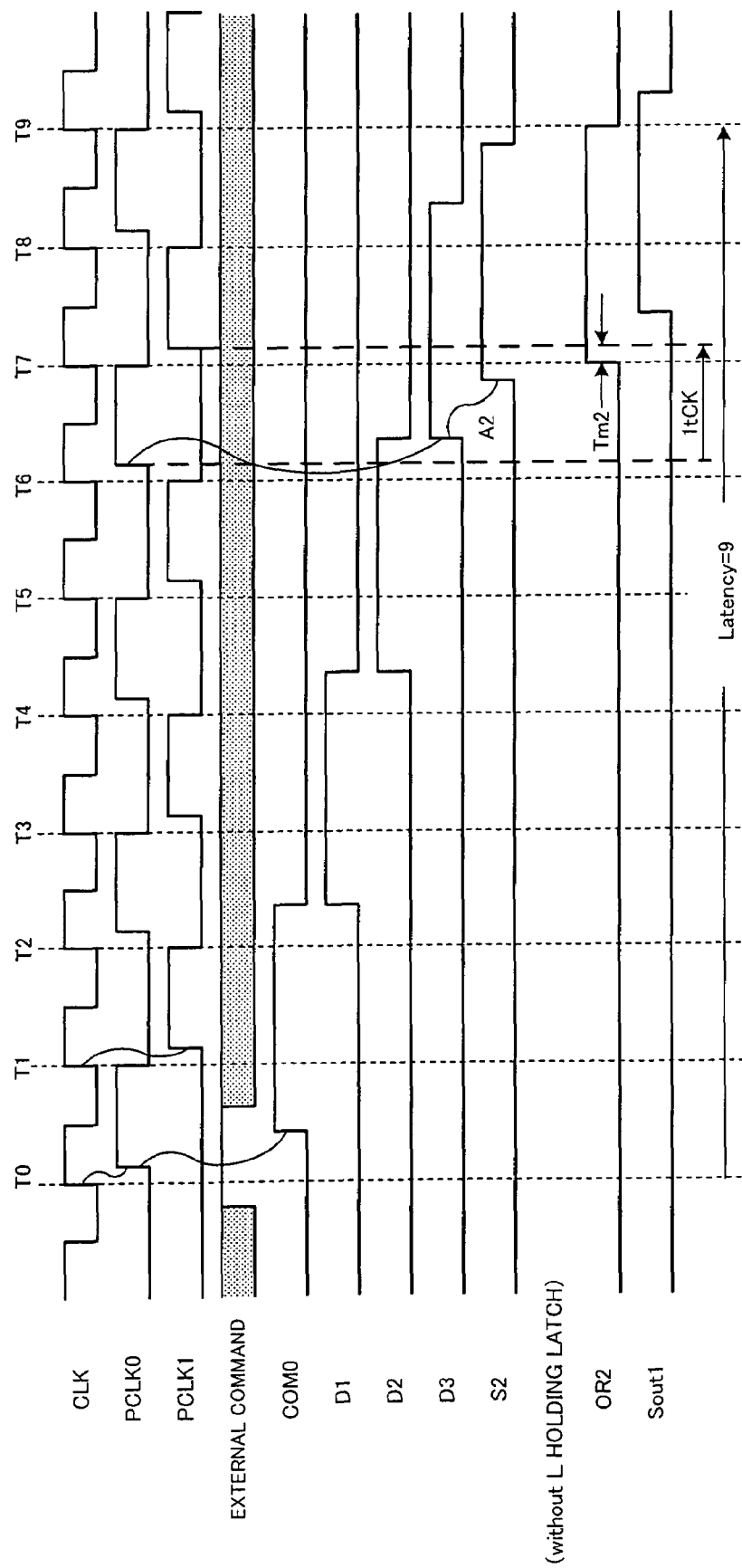
FIG. 9 is a diagram showing operation waveforms at each part of the latency counter in which the period tCLK is lengthened (lower speed) in order to realize the odd number latency 9 in the configuration of FIG. 7, the same as in FIG. 8.

On the other hand, FIG. 9 shows operation waveforms at each part of the latency counter 12 in which the period tCLK is lengthened (lower speed) in order to realize the odd number latency 9 in the configuration of FIG. 7, the same as in FIG. 8. In FIG. 9, the signal path is shifted in the same way as described above from cycle T6 to cycle T7 (refer to A2 in the FIG), and timing margin Tm2 is obtained. When high-speed operation is marginal in FIG. 8, it is effective to lengthen the period tCK as in FIG. 9, but a configuration on the assumption that the operation speed is reduced is not desirable.

Figure 10:
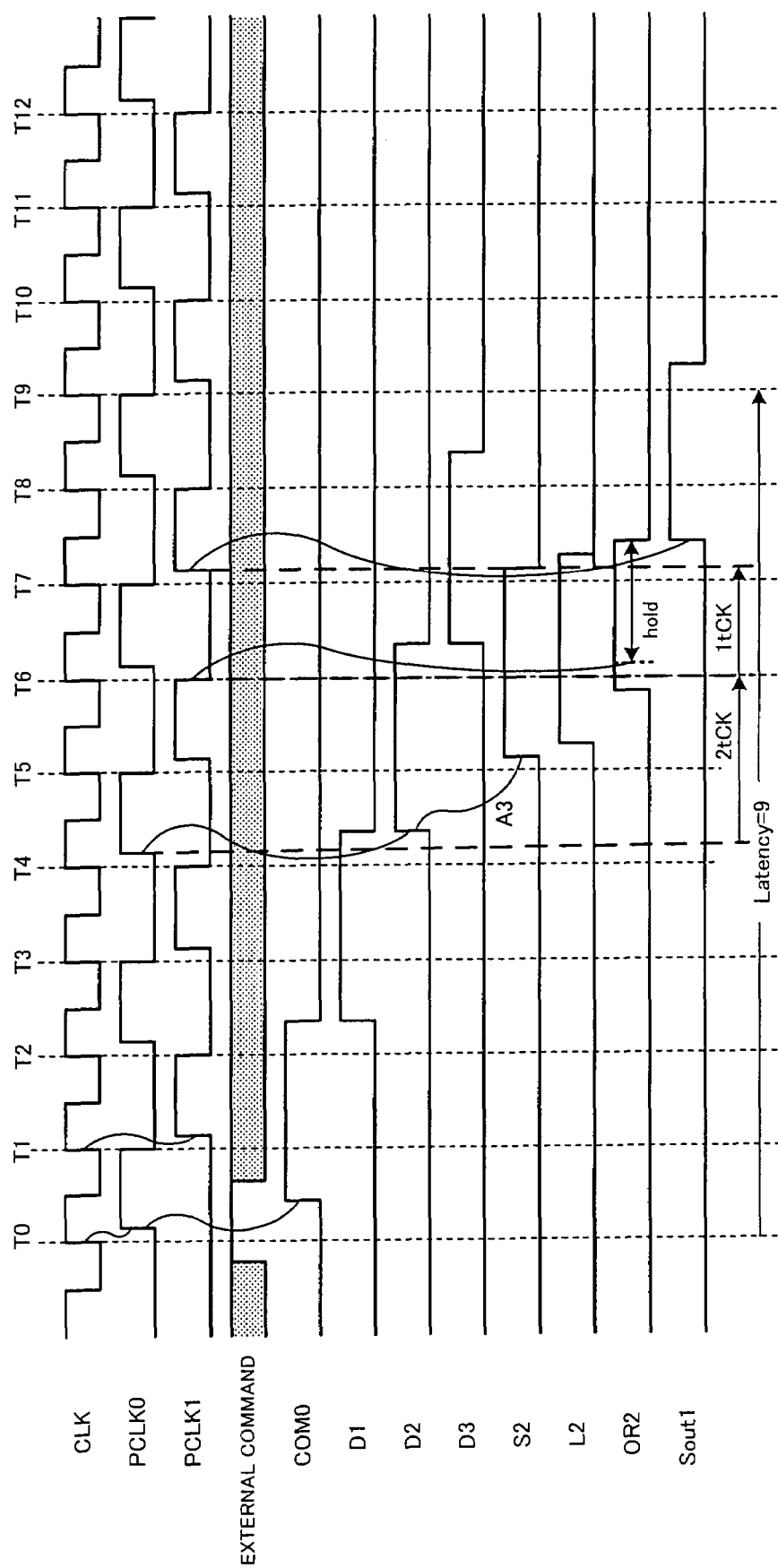
FIG. 10 is a diagram showing operation waveforms at each part of the latency counter of this embodiment under the same condition as in FIG. 8 (the odd number latency 9)
Figure 11:
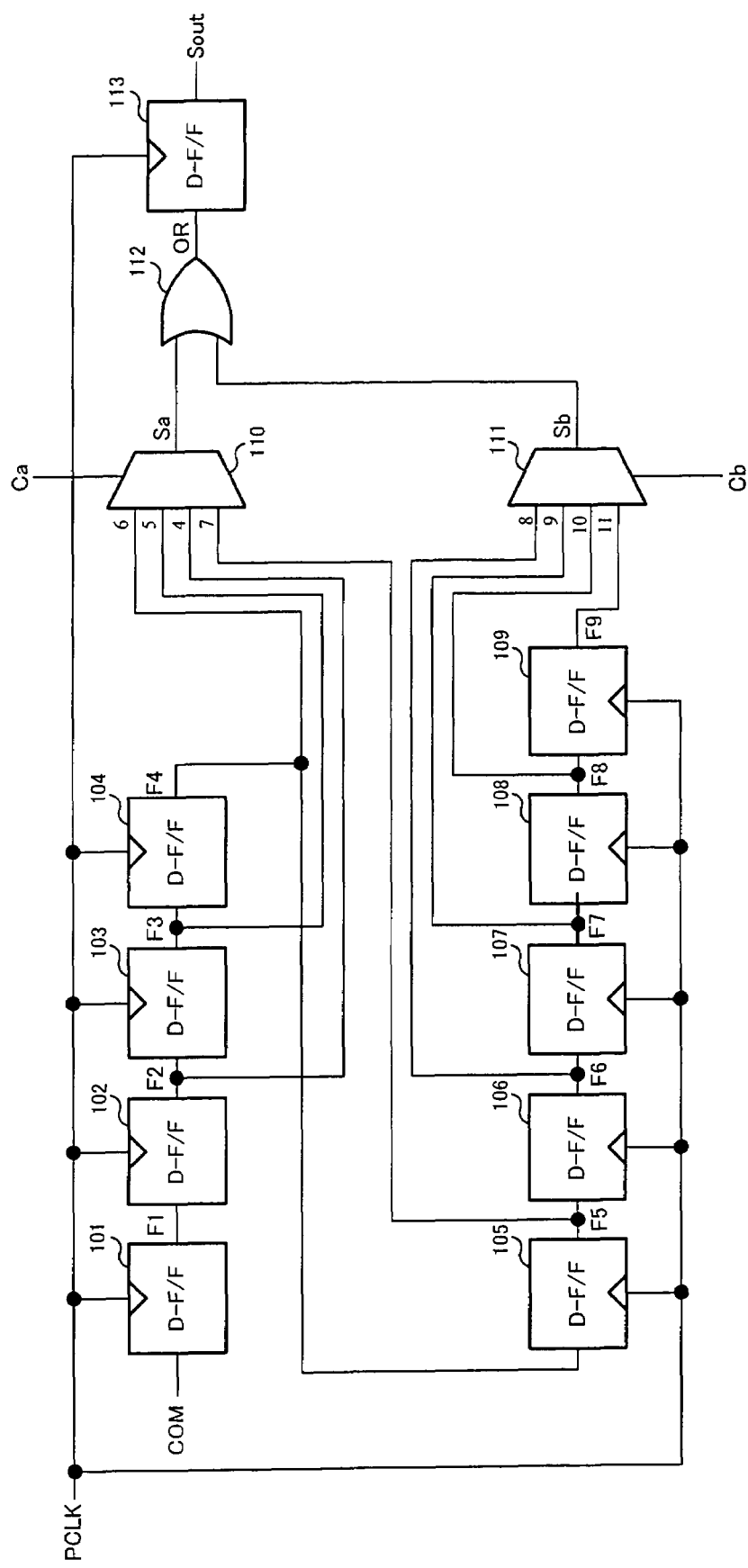
FIG. 11 is a diagram showing an example of a configuration of the latency counter applied to the conventional synchronous semiconductor memory device.
Figure 12:
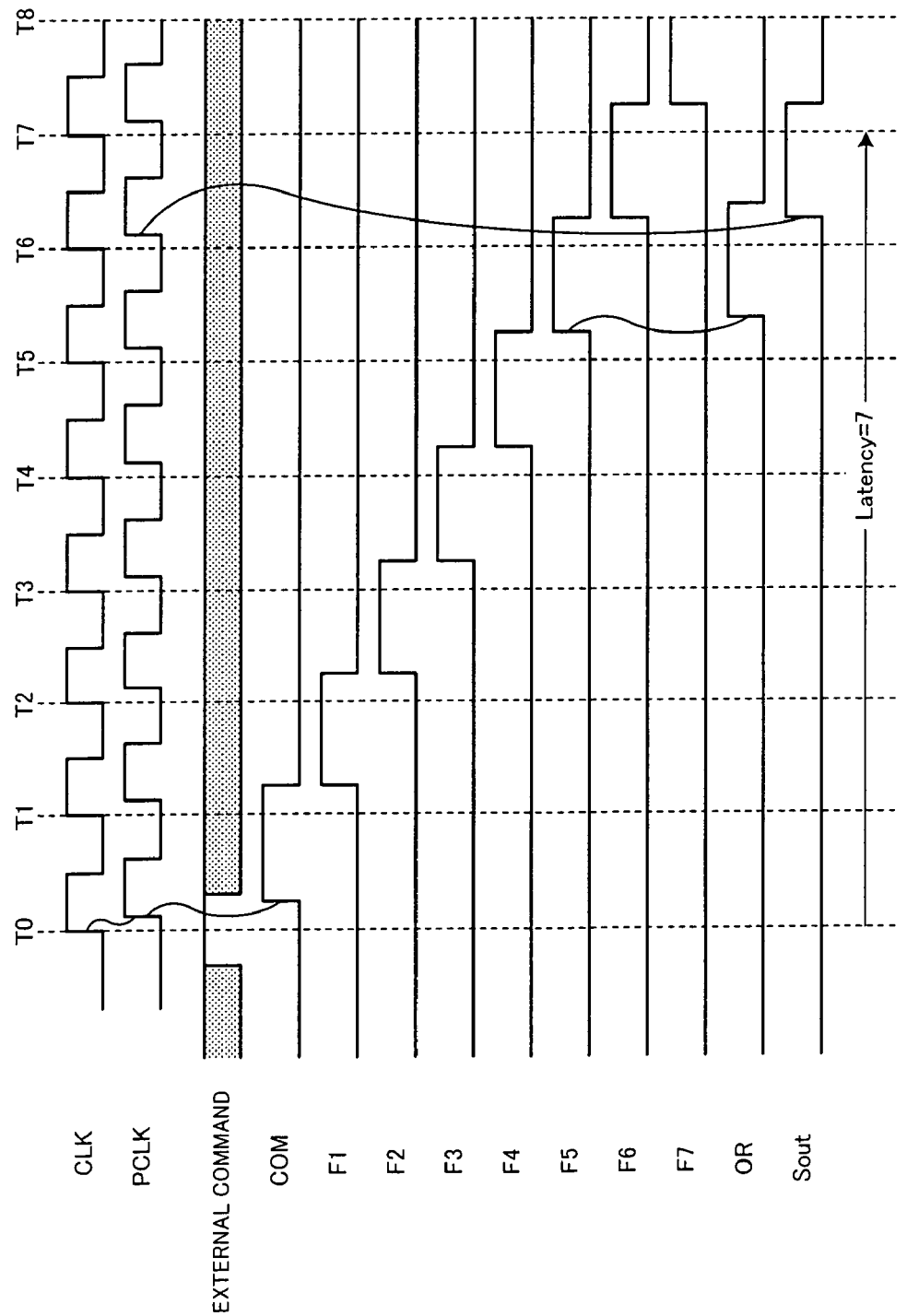
FIG. 12 is a diagram showing operation waveforms at each part of the latency counter of FIG. 11.

In this embodiment, the above-mentioned problem of the operation speed is solved by inserting the L hold latches 41 and 42 in the configuration of FIG. 7. In FIG. 10, operation waveforms at each part of the latency counter 12 of this embodiment under the same condition as in FIG. 8 (the odd number latency 9). As shown in FIG. 10, the signal D2 output form the second-stage D flip flop 22 at cycle T4 is output through the selector 32, and thereafter the signal path is shifted and the signal D2 is latched by the L hold latch 42 (refer to A3 in the FIG). In this case, since the latch timing is the falling timing of the reverse phase clock PCLK1 in latter part of cycle T5, the transfer operation is performed during a time substantially equivalent to 2tCK. Subsequently, operation of the OR circuit 52 is performed during a time equivalent to 1tCK, and thereby the above-mentioned switching operation is completed during the total time equivalent to 3tCK. Based on the comparison between FIG. 10 and FIG. 8, it is clear that the state of cycle T6 in FIG. 8 corresponds to cycle T4 in FIG. 10 which is 2tCK earlier. For shifting the signal path, a short time equivalent to 1tCK is required in FIG. 8, while it is a feature that twice the time equivalent to 2tCK is required in FIG. 10. Based on such an operation of this embodiment, it is possible to solve the above-mentioned problem of the operation speed.

In the case the even number latency is set in the latency counter 12, since each signal does not pass through the L hold latches 41 and 42 but passes through the OR circuits 51 and 52 which operate in high-speed, the above-mentioned problem does not occur.

In the foregoing, the present invention is specifically described based on the embodiment, but is not limited to the above-mentioned embodiments and is capable of being modified in various manners without departing from the scope of the subject matter. For example, the present invention can be applied to synchronous semiconductor memory devices having various standards which require counting latencies in addition to a DDR-SDRAM. In this case, the configuration to realize this embodiment is not limited to the circuit configuration of FIG. 2 but the circuit configuration may be appropriately modified to realize the similar function.

The present invention is not limited to the above described embodiments, and various variations and modifications may be possible without departing from the scope of the present invention.

This application is based on the Japanese Patent application No. 2005-306418 filed on Oct. 20, 2005, entire content of which is expressly incorporated by reference herein.

What is claimed is:

1. A synchronous semiconductor memory device comprising:
    a clock generator for generating a normal phase clock and a reverse phase clock with a phase difference of 180 degree therebetween as internal clocks by dividing an external clock having a predetermined period;
    a command decoder for decoding an external command and outputting a command signal in accordance with a decoding result;
    latency setting means capable of selectively setting an even number latency having a period of an even number times the period of said external clock or an odd number latency having a period of an odd number times the period of said external clock within a range of a predetermined number of clock cycles of said external clock;
    a latency counter which includes a first counter circuit for sequentially shifting said command signal captured using said normal phase clock and being capable of switching a signal path in response to said number of clock cycles and a second counter circuit for sequentially shifting said command signal captured using said reverse phase clock and being capable of switching a signal path in response to said number of clock cycles;
    first control means which, when said even number latency is set, controls counting of said clock cycles equivalent to said even number latency by forming a signal path such that said command signal captured using said normal phase clock passes only through said first counter circuit and said command signal captured using said reverse phase clock passes only through said second counter circuit;
    second control means which, when said odd number latency is set, controls counting of said clock cycles equivalent to said odd number latency by forming a signal path such that said command signal captured using said normal phase clock is shifted from said first counter circuit to said second counter circuit and said command signal captured using said reverse phase clock is shifted from said second counter circuit to said first counter circuit.

2. A synchronous semiconductor memory device according to claim 1, wherein said first and second counter circuits have a symmetrical circuit configuration using the same constituents.

3. A synchronous semiconductor memory device according to claim 2, wherein each of said first and second counter circuits includes an N-stage shift register circuit for sequentially shifting said command signal.

4. A synchronous semiconductor memory device according to claim 3, wherein each of said first and second counter circuits includes a first selector to which said command signal and signals of respective stages of said shift register circuit are input and which passes a signal selected from the N+1 signals and a second selector to which said command signal and signals of respective stages of said shift register circuit are input and which passes a signal selected from the N+1 signals to be shifted to the other counter circuit.

5. A synchronous semiconductor memory device according to claim 4, wherein each of said first and second counter circuits includes an output-side circuit connected to said first selector and to said second selector of said other counter circuit, and wherein a delay time of a signal path through said second circuit and said output-side circuit is one period of said external clock longer than that of said signal path through said first circuit and said output-side circuit.

6. A synchronous semiconductor memory device according to claim 5, wherein 2(N+1) said latencies including N+1 even number latencies within a range from minimum M (even number) to maximum M+2N, and N+1 odd number latencies within a range from minimum M+1 to maximum M+1+2N can be selectively counted in said latency counter.

7. A synchronous semiconductor memory device according to claim 1, wherein said latency setting means includes a mode register for storing a set latency rewritably, and wherein switching of said signal path is controlled by the set latency stored in said mode register.

8. A synchronous semiconductor memory device according to claim 1, wherein a plurality of latencies corresponding to s standard of DDR-SDRAM can be counted in said latency counter.

* * * * *